US008746928B2

(12) United States Patent
Morris et al.

(10) Patent No.: US 8,746,928 B2
(45) Date of Patent: Jun. 10, 2014

(54) FLAG LIGHTING APPARATUS

(76) Inventors: Michelle Morris, Keenesburg, CO (US); John Bode, Woodriver, NE (US)

(*) Notice: Subject to any disclaimer, the term of this patent is extended or adjusted under 35 U.S.C. 154(b) by 251 days.

(21) Appl. No.: 12/835,133

(22) Filed: Jul. 13, 2010

(65) Prior Publication Data

US 2012/0014104 A1 Jan. 19, 2012

(51) Int. Cl.
*F21S 4/00* (2006.01)
*H05K 13/04* (2006.01)

(52) U.S. Cl.
USPC ................. 362/249.11; 362/249.06; 362/253; 362/396; 362/457; 362/249.14

(58) Field of Classification Search
USPC ..................................................... 362/249.06
See application file for complete search history.

(56) References Cited

U.S. PATENT DOCUMENTS 1,171,917 A * 2/1916 Axford ......................... 116/173
3,752,975 A 8/1973 Meyer
5,988,100 A * 11/1999 Schmitt ......................... 116/173
6,067,013 A * 5/2000 Pejic .......................... 340/539.1
6,192,824 B1 * 2/2001 Chang ........................... 116/173
6,380,863 B1 * 4/2002 Swoboda et al. .......... 340/815.4
6,764,197 B1 * 7/2004 Zemar ........................... 362/159
6,955,456 B2 * 10/2005 Schroeder ..................... 362/431
7,217,015 B2 5/2007 Cocciardi
8,215,807 B1 * 7/2012 Brunesti ....................... 362/431
2004/0083633 A1 5/2004 Mueller
2005/0072057 A1 4/2005 Ciaccia
2005/0083693 A1 4/2005 Garrett
2005/0259424 A1 * 11/2005 Zampini et al. ............... 362/294
2005/0284357 A1 12/2005 Vazvan
2006/0023446 A1 2/2006 Racoosin
2006/0109651 A1 5/2006 Cocciardi
2006/0207493 A1 9/2006 Chasmar
2007/0035956 A1 2/2007 Topps
2007/0089338 A1 4/2007 Barnhouse
2009/0290365 A1 * 11/2009 Schroeder ..................... 362/431

* cited by examiner

*Primary Examiner* — Sikha Roy
(74) *Attorney, Agent, or Firm* — Kunzler Law Group

(57) ABSTRACT

The present invention comprise a flag illumination assembly that both (i) illuminates an associated flag from a vertical edge of the flag and (ii) swivels with the edge of the flag as the flag is tossed in the wind. The foregoing facilitates illumination of the flag regardless of the direction of the wind. Further, a simmering effect is often created as a result of natural undulations of the flag in wind relative to the beams of light being directed thereon from the illumination assembly.

20 Claims, 7 Drawing Sheets

FLAG LIGHTING APPARATUS

FIELD OF THE INVENTION

The present invention pertains to flag illumination apparatus.

BACKGROUND

Generally, it is desirable when flying a flag in the evening or night to illuminate the flag. In fact, Title 4 Chapter 1 of the United States Code specifically requires the U.S. flag to be illuminated when in darkness.

Traditionally, illumination has been provided by a spot light located on the ground proximate the base of a flag pole with the light source aimed at the flag. There are several problems associated with this approach. Most notably, the spot lights must be relatively high powered such that a suitable beam of light can be transmitted the entire distance from the light source to the flag which may be tens of feet in the air. As can be appreciated, these lights require significant amounts of energy that not only adds to the cost of flying a flag at night but also places added pressure on the Nation's already strained power grid.

Another problem associated with ground-based spot lights is that the lighting apparatus is generally stationary and as such it directs a highly directional unmoving beam of light. Flags on the other hand tend to move depending on the directionality of the wind. As such, when the wind is not coming from the typical prevailing direction for which the spot light is adjusted and aimed, all or part of the flag may not be illuminated.

To resolve the foregoing problems several solutions have been offered with varying degrees of success. Spot lights mounted on the flag pole itself are currently offered in the marketplace. Because these are located closer to the flag, they require less energy and are more efficient. They do not, however, solve the directional problem. Others have proposed mounting these light assemblies on swivels so that they track with the flag; however, the complexity of the hardware used to fly a flag increases substantially over a more traditional halyard configuration.

Others have suggested lights horizontally disposed over the flag wherein the flag is essentially draped from the rigid framework of the light assembly. This solution does provide for constant illumination at a reasonable light output but it cause the flag to fly in an unnatural manner that is not pleasing to many. Further, this solution does increase the complexity of the flag hanging hardware substantially.

Yet others have suggested providing flagpoles that have lighting assemblies incorporated therein that often send light rays emanating 360 degrees outwardly from the pole. Some references have suggested that a flag pole with a transparent portion adjacent the flag is used with a lighting assembly situated inside of the transparent portion. This has many problems not the least of which is the added expense of producing the relatively complex pole. With the light being directed 360 degrees, this design is not particularly efficient. Additionally, if only the top portion of the pole is transparent, a user cannot use the pole to fly a flag at night at half mast since that portion of the pole is unlikely to include an additional transparent illuminating section.

DETAILED DESCRIPTION

Figure 1:
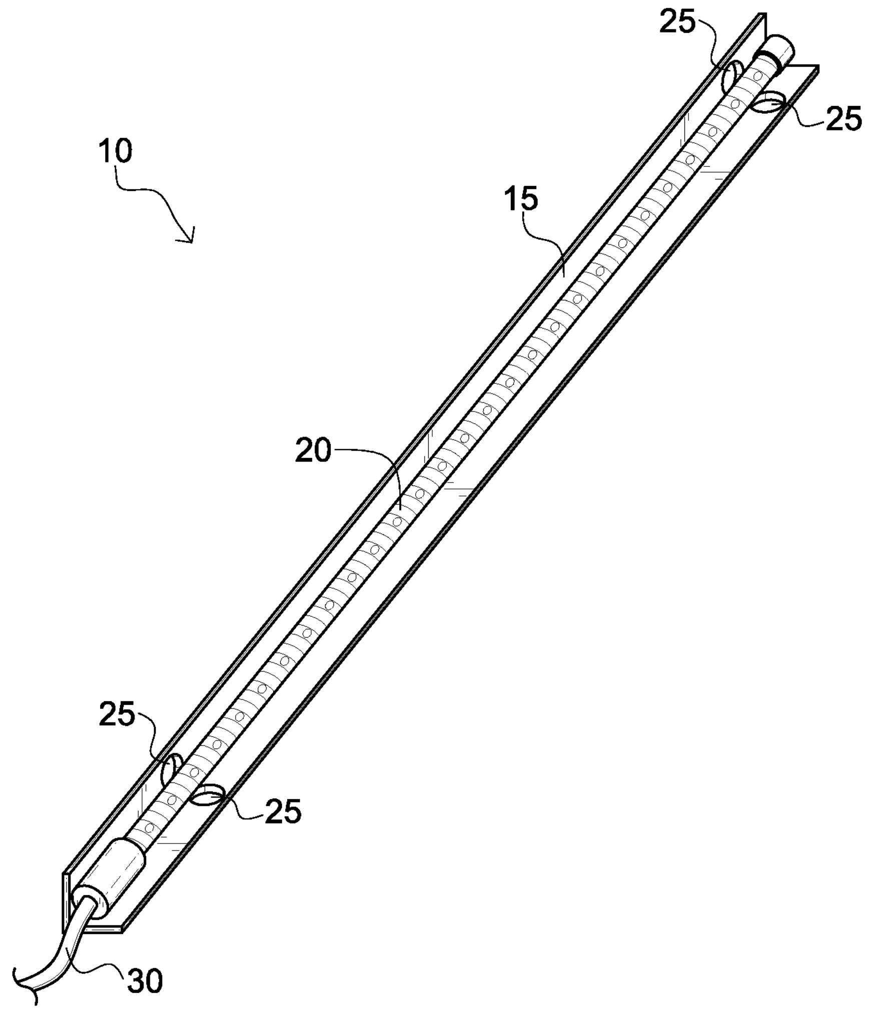
FIG. 1 is an isometric illustration of a flag illuminating assembly according to one embodiment of the present invention.

Embodiments of the present invention comprise a flag illumination assembly that both (i) illuminates an associated flag from a vertical edge of the flag and (ii) swivels with the edge of the flag as the flag is tossed in the wind. The foregoing facilitates substantially constant illumination of the flag regardless of the direction of the wind. Further, a simmering effect is often created as a result of natural undulations of the flag in wind relative to the beams of light being directed thereon from the illumination assembly.

The illumination assembly is characterized by an elongated bar or rod that is typically but not necessarily at least the length of the vertical edge of an associated flag. The bar includes a lengthwise extending channel that in use is disposed to face the proximal vertical edge of the flag. Within the channel a plurality of lights are distributed along the channel's length to essentially facilitate illumination of the flag along its entire distal edge. The edges of the channel, which are typically light reflective help direct the beams of light onto the flag. In at least one variation, energy efficient LEDs are utilized but other types of bulbs can be used in other variations. Additionally, at least one variation is contemplated wherein the plurality of lights are replaced with one or more fluorescent bulbs that extend most of the length of the channel.

The lights are operatively coupled with a power supply and or controller by way of an electrical cord which may extend down the flag pole and terminate in a plug suitable for connection with a suitable AC receptacle. In other variations, the electrical cord may couple to a battery pack and/or set of photovoltaic cells resulting in a unit that does not require connection to an electrical power grid.

In its most basic form the power supply transforms AC voltage to DC voltage and steps the voltage down to a suitable level for use by LEDS or other light bulbs. It is to be appreciated in some variations that utilize AC powered light bulbs a power supply may not be required. In more advanced variations the power supply may also contain controller circuitry to control the operation of the illumination assembly. For instance, a light sensor may be provided along with logic circuitry that turns the assembly on and off depending on the ambient light levels. In yet other variations, the controller may include clock and/or timer circuitry that controls the time in which the assembly is energized and the length of time the assembly remains energized.

In at least some embodiments, the assembly is coupled directly to a halyard or flag post rings using opening provided in the bar. In at least one variation, the bar is coupled to the halyard or flag pole by way of zip ties or any other suitable fasteners. The flag itself is then attached to the bar often instead of attachment to the halyard or pole directly most typically through the same openings in the bar also using zip ties or other suitable fasteners. As a result, the illumination assembly is able to pivot relative to the flag pole and to swivel with the flag in response to changing wind directions. Additionally, the flag is free to undulate in the wind depending on the varying intensity of gusts unhindered by the illumination assembly. In certain wind conditions, this causes portions of the flag along its length to move in and out of the beam of light emanating from the assembly giving the flag a shimmering appearance from the perspective of a person viewing the flag.

The simple manner in which embodiments of the illumination assembly connect with all standard types of flag poles and associated hardware allows for its use with existing pole systems without having to modify the attachment hardware in a significant manner. Further, because it is attached directly to a halyard it is raised and lowered in conjunction with the flag itself permitting easy deployment and as necessary removal. Additionally, given the relatively slender profile of the bar and its unobtrusive appearance it effectively blends in with the pole as viewed from a distance and therefore does not distract substantially from the visual majesty of a flag attached to it during either daytime or nighttime hours.

TERMINOLOGY

The terms and phrases as indicated in quotation marks (" ") in this section are intended to have the meaning ascribed to them in this Terminology section applied to them throughout this document, including in the claims, unless clearly indicated otherwise in context. Further, as applicable, the stated definitions are to apply, regardless of the word or phrase's case, tense or any singular or plural variations of the defined word or phrase.

The term "or" as used in this specification and the appended claims is not meant to be exclusive rather the term is inclusive meaning "either or both".

References in the specification to "one embodiment", "an embodiment", "a preferred embodiment", "an alternative embodiment", "a variation", "one variation", and similar phrases mean that a particular feature, structure, or characteristic described in connection with the embodiment is included in at least an embodiment of the invention. The appearances of phrases like "in one embodiment", "in an embodiment", or "in a variation" in various places in the specification are not necessarily all meant to refer to the same embodiment or variation.

The term "integrate" or "integrated" as used in this specification and the appended claims refers to a blending, uniting, or incorporation of the identified elements, components or objects into a unified whole.

Directional and/or relationary terms such as, but not limited to, left, right, nadir, apex, top, bottom, vertical, horizontal, back, front and lateral are relative to each other and are dependent on the specific orientation of an applicable element or article, and are used accordingly to aid in the description of the various embodiments and are not necessarily intended to be construed as limiting.

As applicable, the terms "about" or "generally" as used herein unless otherwise indicated means a margin of +−20%. Also, as applicable, the term "substantially" as used herein unless otherwise indicated means a margin of +−10%. It is to be appreciated that not all uses of the above terms are quantifiable such that the referenced ranges can be applied.

A "flag" as used herein comprises a piece of cloth or other sheet material that is usually but not necessarily rectangular, of distinctive color and design, used as a symbol, standard, signal, or emblem. A flag typically has at least one linear side or edge configured to be positioned adjacent a flag pole. Specifically, two or more grommets are often provide proximate this edge to be secured to flag pole mounting hardware. As used herein the mounting edge is referred to as a "vertical edge" or "vertical side" of the flag even though depending on how the flag is flown the edge or side may not be vertically disposed. Of note rectangular flags will usually have a second vertical side or edge opposite the flag hanging vertical edge.

An Embodiment of a Flag Illumination Assembly

Figure 2:
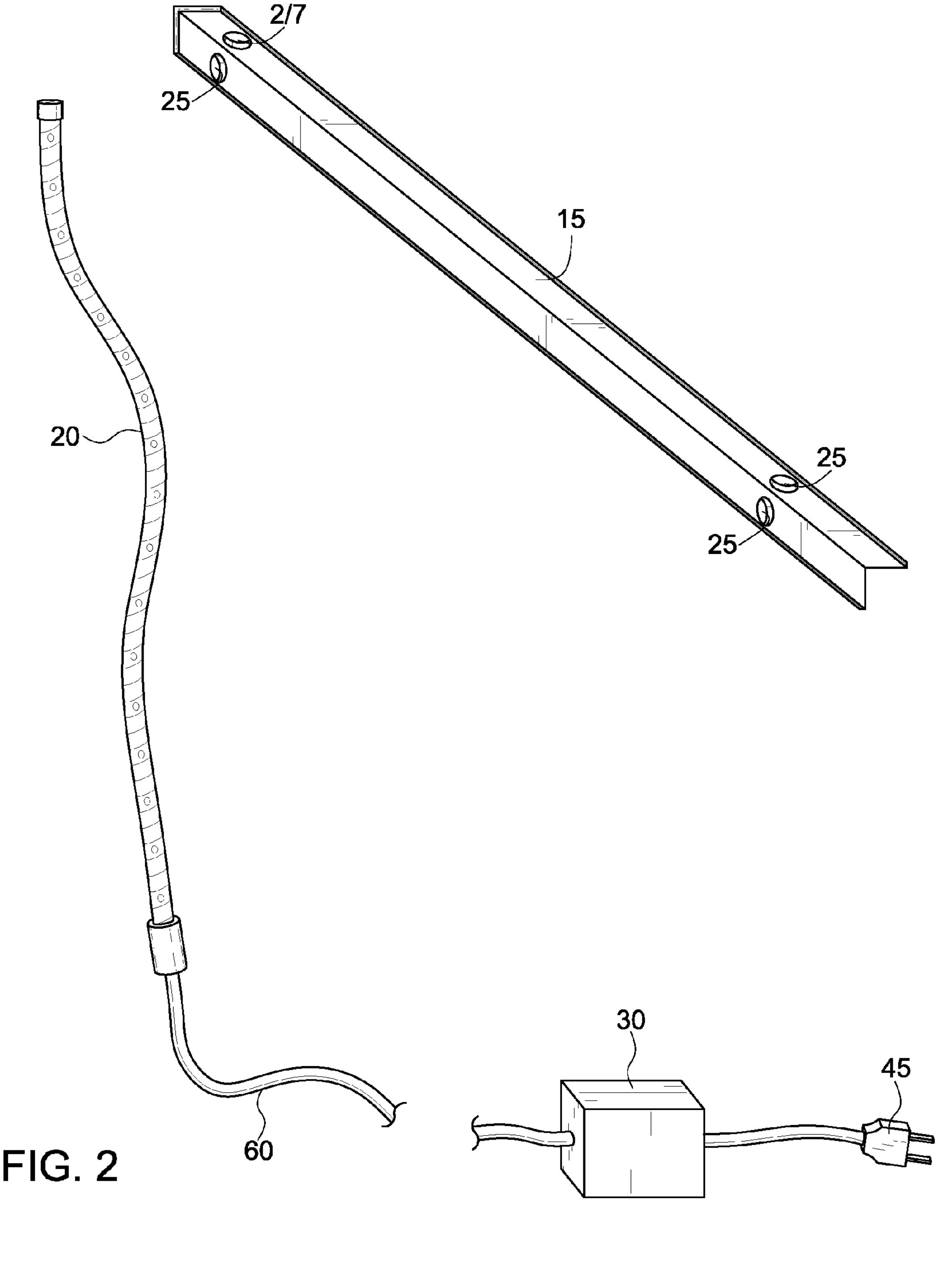
FIG. 2 is an exploded view of the assembly of FIG. 1 according to one embodiment of the present invention.
Figure 3:
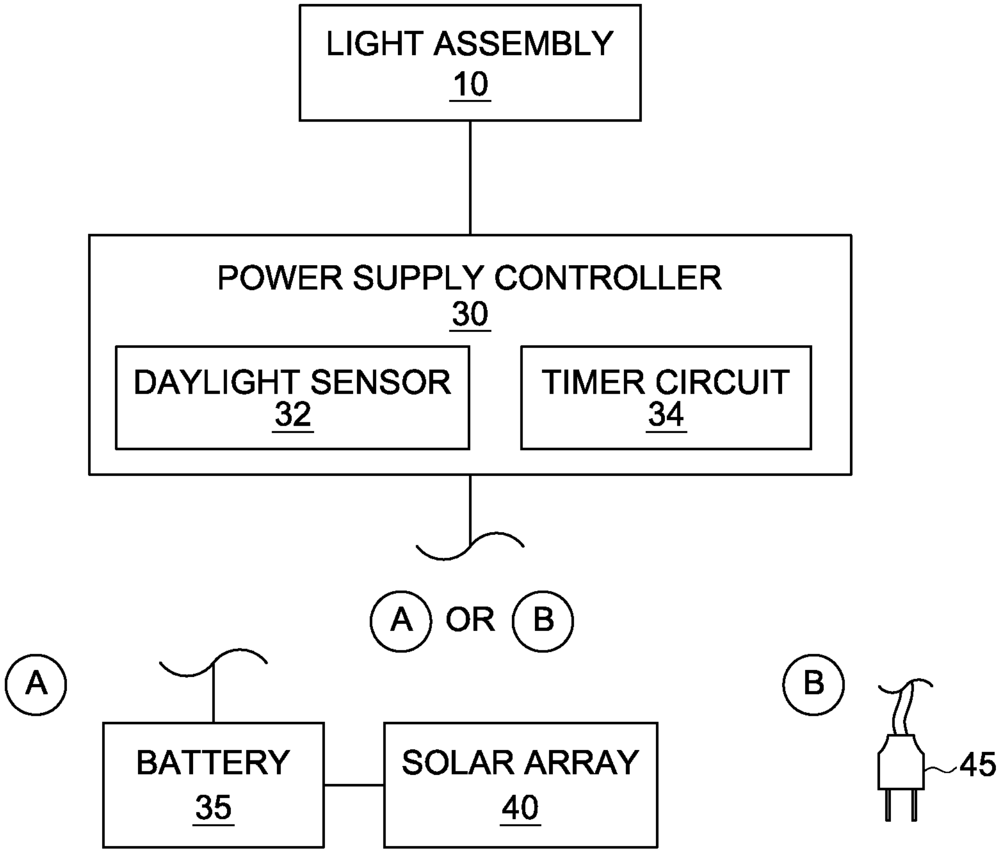
FIG. 3 is a block diagram of a flag illuminating assembly according to one embodiment of the present invention.
Figure 4:
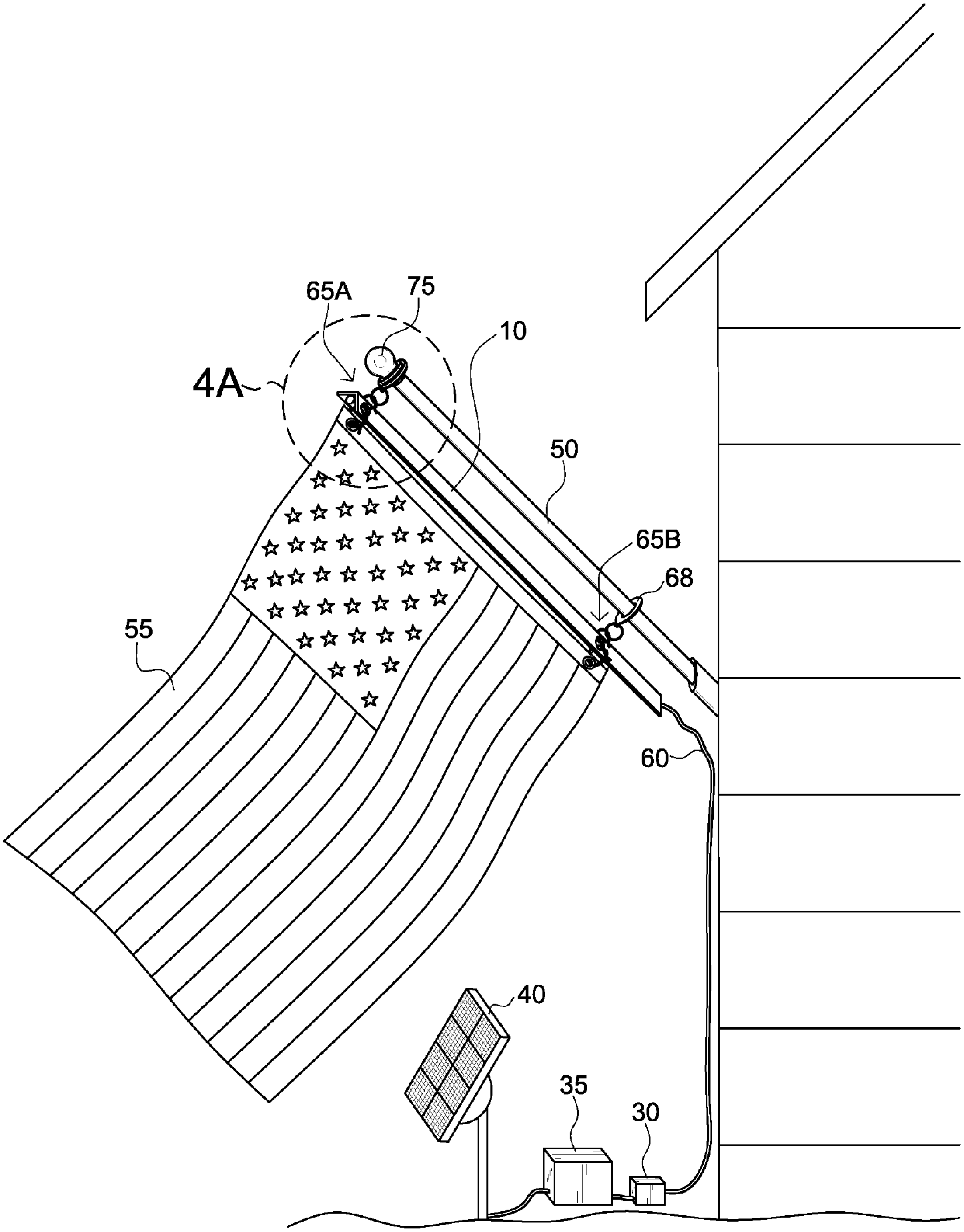
FIG. 4 is an illustration showing the flag illuminating assembly in combination with a flag and an outrigger flag pole attached to the side of a building according to one embodiment of the present invention.

FIGS. 1 and 2 are representations of an embodiment of a flag illumination assembly. A typical assembly comprises: (i) an elongated rod or bar including a channel disposed along its lengthwise or longitudinal length, such as the illustrated aluminum angle 15; (ii) a means of illumination typically comprising a plurality of lights extending along and distributed in the channel, such as the illustrated light rope 20; (iii) electrical cord 30 and/or conduit to deliver electrical current to the lights; and (iv) various connectors and hardware, such as zip ties shown in FIGS. 4 and 4A, to secure the assembly to a flag and flag pole hardware. Depending on the lighting technology used in particular variations, a power supply 60 may also be included in the assembly. In some variations as shown in FIGS. 3 & 4, photovoltaic cells 40 and associated batteries 35 can be used to power the lights.

Referring to FIGS. 1 & 2, the elongated rod/bar comprises aluminum angle 15 which forms and interior channel comprising two interior faces that intersect along a longitudinal edge at a 90 degree angle. The angle can be comprised of materials other than aluminum including plastic and other metals. Of note, the interior faces are generally reflective of light and, as such in use, reflect the light beams incident thereon generally in the direction of an associated flag. In the case of an aluminum angle and other metallic angles, the interior faces may be left in their natural state such as after extrusion or they can be polished, painted or plated to enhance reflectivity. Concerning variations using plastic angles or rods, the interior faces are typically coated with a reflective layer.

The length of aluminum angle 15 is typically as long as or slightly longer than the height dimension of the size of flag it is intended to fly with. The width of the angle's face is typically about 0.75-2.0" with the dimension varying depending on the size of flag with which it is associated. While a rod comprising 90 degree angle aluminum is illustrated, rods of other shapes can be utilized as well. Further, the shape of the interior channel can vary significantly. For instance, while the 90-degree v-shaped interior of the channel has been found to be particularly effective, channels having arcuate and/or "U" shapes can also be utilized as can angles having intersecting angles less or more than 90 degrees.

Figure 4A:
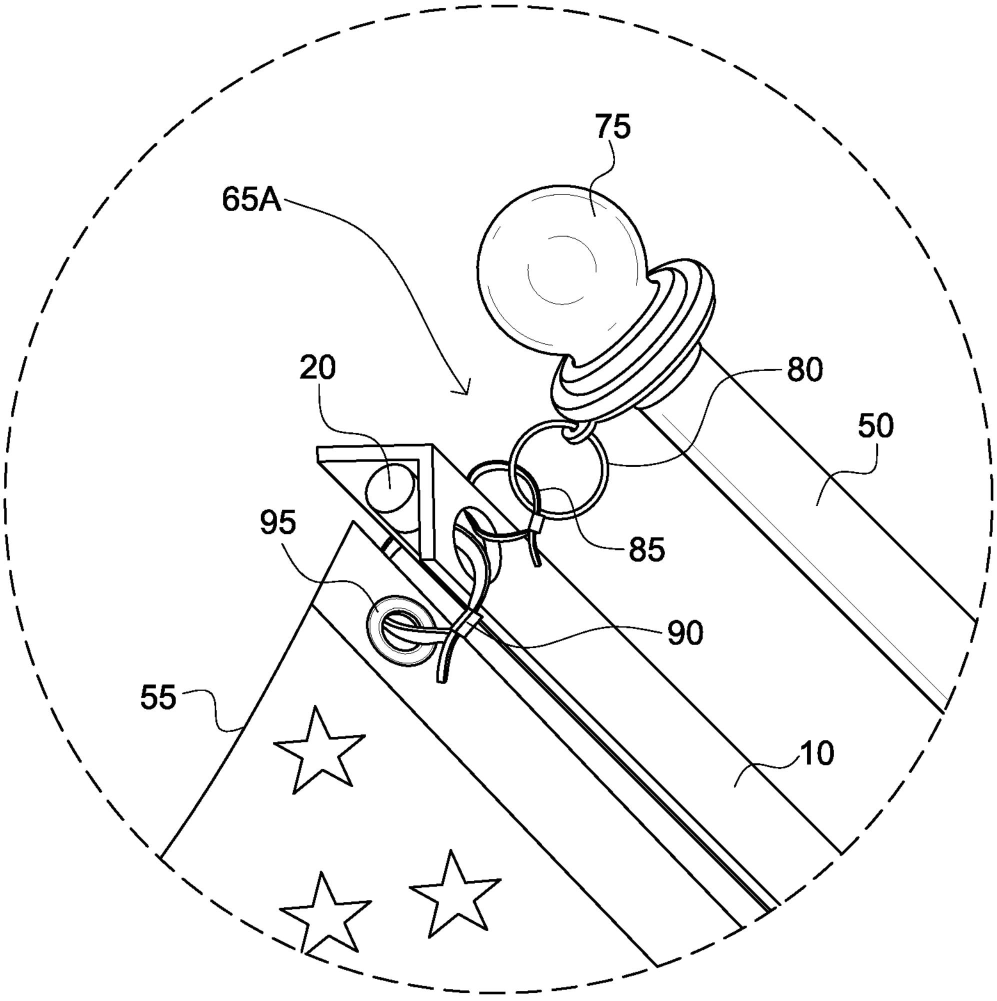
FIG. 4A is an enlarged section from FIG. 4 illustrating in greater detail the hardware associated with mounting the flag illuminating assembly and a flag to an associated flag pole according to one embodiment of the present invention.
Figure 5:
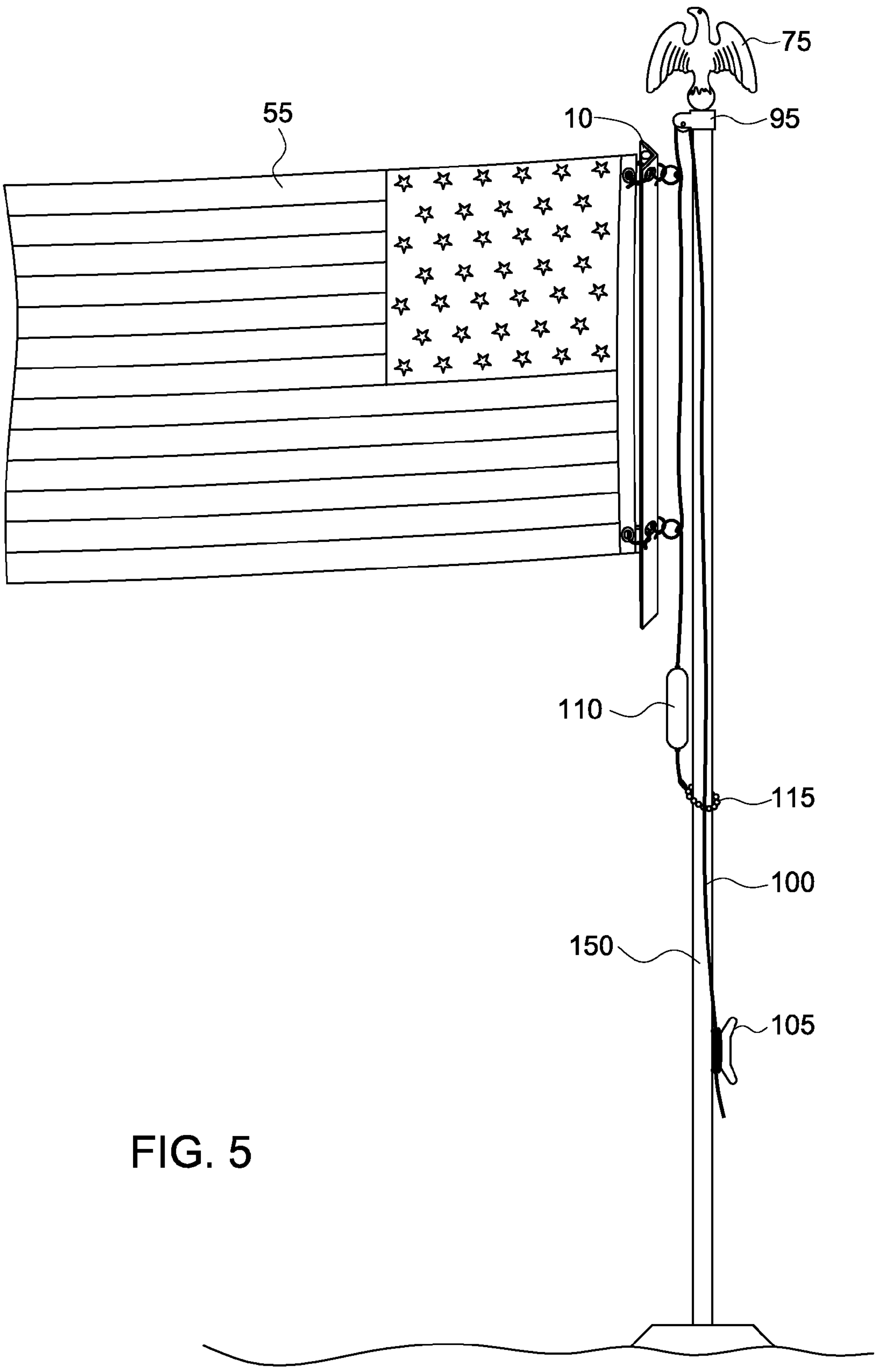
FIG. 5 is an illustration showing the flag illuminating assembly in combination with a flag and a vertical flag pole wherein the flag can be raised and lowered by way of the halyard according to one embodiment of the present invention.

Openings or holes 25 are provided in the legs of the angle 15 proximate its top and bottom ends. These holes provide a means for securing the assembly 10 to both the flag 55 and the flag pole 50 & 100 hardware 65 (as shown in FIG. 4 for example). Typically, the assembly is disposed between the flag mounting hardware of an associated flag pole 50 and the flag 55 itself. The mounting of the illumination assembly relative to the flag pole and the flag is best illustrated in FIGS. 4, 4A and 5 and is described in greater detail below.

Referring again to FIGS. 1 & 2, the illustrated means of illumination comprises a light rope 20. Light ropes as commonly known comprise a plurality of illumination sources (or lights) encased in and distributed along a flexible elongated carrier. Typically, the carrier is made from a translucent semi-elastomeric or elastomeric polymer that imparts flexibility to the rope. Functionally, the polymeric casing holds the various illumination sources in place evenly spaced from each other and protects the illumination sources from the environment and incidental impact.

The light rope 20 and the illumination sources are electrically coupled to an electrical conduit/cord 60 that is optionally coupled to a power supply 30 and/or terminates in a connector, such as a plug 45, for receipt into a standard AC current receptacle. In one variation, the illumination sources comprise light emitting diodes (LEDs) but in others the sources can comprise other technologies, such as but not limited to incandescent bulbs.

The light rope 20 is secured to the bottom of the angle's channel typically at the intersection of the respective faces. In at least one variation the rope 20 is adhesively bonded to the channel with a weather resistant adhesive, such as silicone. In other variations, the rope can be secured to the angle or other bar/rod by other means including zip ties or other fasteners that encircle the rope and are placed through corresponding holes in the angle 15.

It is to be appreciated that light rope 20 represents just one type of means for illumination that can be utilized with variations of the illumination assembly. For instance, the light rope can be replaced with a string of illumination sources interconnected with electrical conduit similar a string of Christmas tree lights. The illumination sources on the light string can comprise any suitable type of light source including LEDs and incandescent bulbs. In yet another variation, the illumination source can comprise one or more elongated fluorescent bulb assemblies that extend a substantial portion of the length of an associated channel.

As mentioned above electrical cord or conduit 60 typically extends from one end of the light rope 20 and terminates at a means for connecting the conduit to a power supply 30. In the variation illustrated in FIG. 2 a power supply is provided along the run of conduit. A power supply is typically necessary when LED illumination sources are utilized to both convert the AC current from a standard AC receptacle to DC current and to reduce the voltage to levels compatible with the LEDs. In variations using incandescent bulbs a power supply may or may not be provided depending on whether the incandescent bulbs utilized are of the low voltage variety or those that can operate using 120 v current.

In some variations, the power supply 30 can also include controller functions to determine whether or not power is delivered to the light rope. As illustrated in the FIG. 3 block diagram, the light rope 20 is coupled to the power supply/controller 30, which includes one or both of a daylight sensor 32 and a timer circuit 34. The daylight sensor senses the level of ambient light and includes control circuitry to switch the delivery of power to the light rope on or off depending on the ambient light level. Most typically, the daylight sensor will cause the power supply to switch on during the darkness of night and turn off in the light of the day.

A timer circuit 34 can be incorporated with the daylight sensor 32 in a power supply 30 or incorporated in a power supply not using a daylight sensor. When used absent a daylight sensor, the timer circuit is typically configured to turn the power supply 30 on at certain time and turn it off at another later time. Presumably, a user would set the timer circuit to switch the power supply on at or around dusk and switch the power supply off at daybreak. Alternatively to save energy, the power supply can be set to turn off in the early morning hours when the likelihood that anyone would view the illuminated flag is substantially reduced. In a variation incorporating both a timer circuit and a daylight sensor, the power supply can be configured to switch on when dusk arrives but turn off some period of time thereafter, such as in the early morning hours.

Still referring to FIG. 3, the power supply 30 is typically coupled with a power source that in one variation is accomplished by inserting a plug 45 provided on the end of the cord/conduit 60 into an available AC current receptacle. Alternatively, the power supply can be coupled with a battery 35 or bank of batteries. In yet another variation, battery is configured to provide the level of voltage at which the light assembly operates thereby obviating the need for a power supply to transform or regulate the voltage level provided to the assembly.

As is commonly known, batteries must be periodically charged. Concerning the variations of the flag illumination assembly 10, this can be accomplished in a variety of ways including providing a power supply 30 coupled with the battery 35 and a standard AC current receptacle that provides DC current to the battery to periodically recharge it or providing an array of photovoltaic cells 40 as shown in FIGS. 3 & 4 to recharge the battery during the daylight hours. A variation showing a deployed flag illumination assembly including a combination battery and photovoltaic cell array power source is shown in FIG. 4.

A Combination of a Flag Illumination Assembly, a Flag Pole and a Flag According to Embodiments FIGS. 4, 4A, 4B & 5 illustrate the flag illumination assembly deployed between two different types of flag poles. Specifically, FIG. 4 illustrates the illumination assembly and an associated flag installed on an outrigger flag pole as is typically secured to the sides of buildings; whereas, FIG. 5 illustrates a flag and illumination assembly installed on a vertical flagpole that includes a halyard that permits the flag and assembly to be raised and lowered. The halyard and associated hardware in the illustration are exposed, but as can be appreciated by those of skill in the art, vertical flag pole assemblies having internal halyards and hardware are well known. It is to be further appreciated that whether the halyard is of the internal or external variety, embodiments of the flag illumination assembly can be used. FIG. 4A shows a typical attachment means used to secure the flag and illumination assembly to a flag pole or by analogy the halyard associated with a vertical pole.

FIG. 4 illustrates a typical combination using an outrigger flag pole 50 as is a typical manner in flying a flag in residences. Flags 55 mounted to outrigger poles are generally accessible by a person and as such do not require a halyard or associated hardware to permit the flag to be raised or lowered, although there are commercial variations that do incorporate halyards. Rather, a person can simply connect and detach the flag at the provided hardware 65 either while in a standing position on the ground or while standing on a ladder or step-stool. Normally in set ups not including a flag illumination assembly, the upper hardware 65*a* is fixed to the flag pole near its top end or finial 75; whereas, the hardware 65*b* that attaches to the lower portion of the flag can be fixed in place or connected to the pole by a ring that permits it to slide upwardly and downwardly along the pole to accommodate flags of different sizes. Nevertheless, the manner in which the pole attaches to a flag or in embodiments of the present invention to the flag illumination assembly is similar for both the upper and lower hardware.

As shown in FIG. 4 and in detail in FIGS. 4A&B, the flag illumination assembly 10 is secured to the flag pole attachment hardware 65*a&b* and the associated flag 55 is secured to the illumination assembly. Specifically as shown, the flag illumination assembly 10 is secured to metal rings 80 of the flag pole hardware with zip ties 85 as shown in detail for the upper hardware in FIGS. 4A&B. On the upper hardware 65*a*, the metal ring of the flag pole attachment hardware is usually secured though an opening provided in a proximate the top of the flag or within a portion 70 of the finial 75 As can be appreciated, other suitable connectors other than zip ties can be utilized, such as but not limited to metal split rings, rope or twine, wire and chain. In the variation shown in FIG. 4A, the zip ties pass through an associated upper or lower attachment holes 25 provided in the angle. The connection between the pole and the angle is not fixed or rigid permitting the assembly to move and pivot side to side relative to the pole typically in response winds loads transferred to the assembly by way of the associated flag 55. The ability of the assembly to move relative to the pole positively affects the illumination of the flag, which also moves relative to the pole.

Still referring to FIG. 4A, the angle 15 is also connected to the attachment grommets 95 of the associated flag through the upper and lower attachment holes 25 by a second set of zip ties 90. As with the connection between the assembly and the pole, different types of connectors can be used in place of zip ties to couple the flag with the assembly. It is further appreciated that the connection between the assembly and the flag is also somewhat flexible permitting the flag to move and pivot side to side partially independently of the assembly. As with the connection between the assembly and the pole, this partial freedom of movement positively affects the illumination of the flag as the flag moves in the wind creating the aforementioned shimmering effect under certain environmental conditions.

Figure 4B:
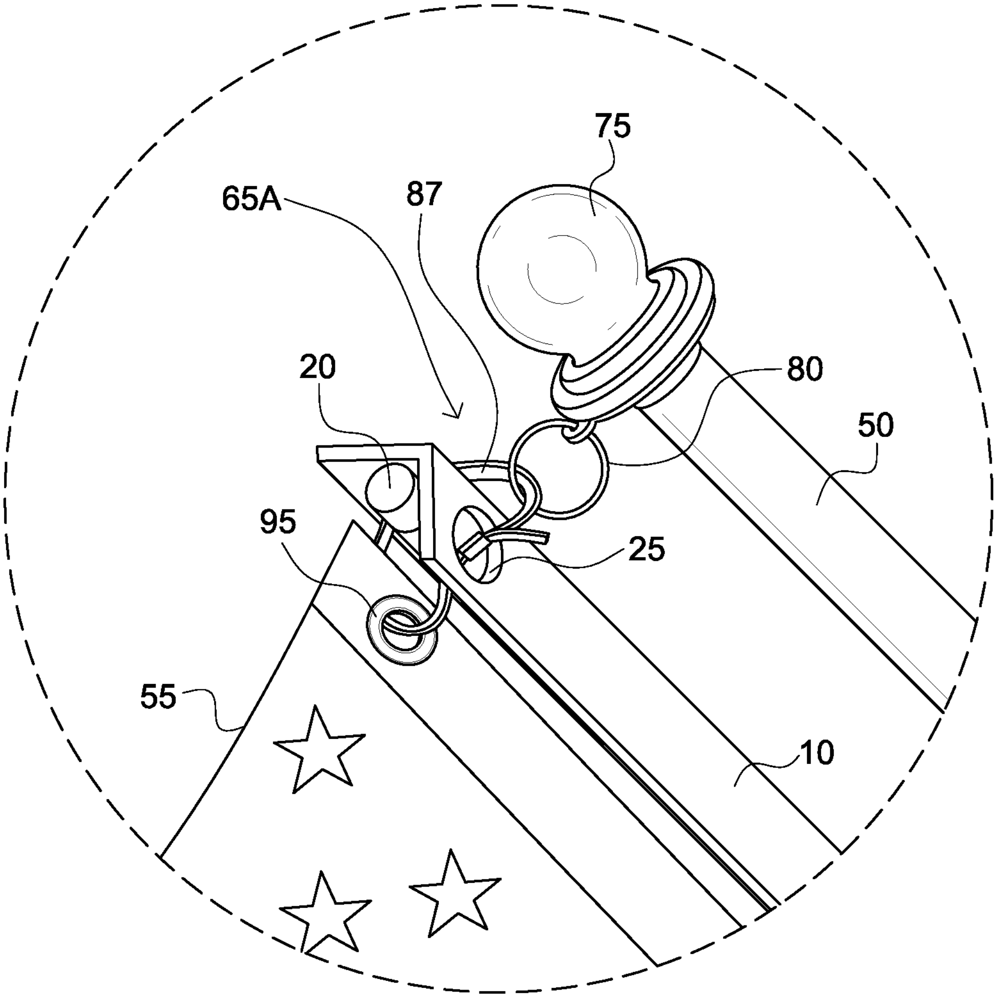
FIG. 4B is an alternative to the enlarged section shown in FIG. 4A illustrating another manner of mounting the flag illuminating assembly and a flag to an associated flag pole according to one embodiment of the present invention.

Another manner of coupling the flag 55 and flag illumination assembly 10 to the flag pole is shown in FIG. 4B wherein a single zip tie 87 is utilized in place of the two zip ties 85 & 90 shown in FIG. 4A. Specifically, the single zip tie is fed through (i) a metal ring 80 of the flag pole, (ii) the two attachment holes of the angle 15 and (iii) the flag grommet 95 wherein it is secured to form a loop. The single zip tie configuration permits the illumination assembly to generally move with the adjacent vertical edge of the flag although the flag is free to slide along the zip tie at the grommet thereby allowing the desired shimmering effect under certain environmental conditions.

Extending from the bottom edge of the lighting assembly is an electrical cord 60. As shown in FIG. 4 the cord is routed along the face of the associated building to a power supply 30 located on the ground. The cord is provided with some slack between the base of the angle 15 and its connection to a building or for longer poles including vertical poles to the pole itself. This slack permits the assembly to move side to side more freely without being unduly hindered by the cord. In some variations, such as shown in FIG. 2, the power supply can be in line with the cord and located at any of a variety of positions along the cord. For instance, in one variation the power supply might be located much more closely to the angle such that it is either mounted to the wall of a building or hangs freely with the slack portion of the cord between the assembly and the cord's coupling to the building. Given the low load required by LED lights used in certain variations, the size and weight of the power supply can be relatively small especially compared to the exaggerated size presented for illustrative purposes in FIG. 4.

The flag illumination assembly illustrated in FIG. 4 further includes a battery pack 35 and a panel of photovoltaic cells 40. Accordingly, the assembly can be used on buildings that are off the grid or in locations were access to an AC power receptacle is not convenient. As is obvious, a similar configuration can be used with a vertical flag pole combination. Further instead of using a photovoltaic and battery power source, the assembly could be configured to be plugged into an available AC receptacle. In use, the battery is charged during daylight hours by the photovoltaic panel and provides power to the lights of the assembly during night time hours. As can be appreciated, the photovoltaic panel, the battery pack and the power supply can be integrated into a single unit or package rather than being separate components as shown in FIG. 4.

FIG. 5 illustrates the flag illumination assembly 10 in combination with a vertical flag pole 10 and associated flag 55. A typical vertical flag pole uses a halyard 100 and associated hardware 105, 95, 110 & 115 for flying, hoisting and lowering the flag thereon. Typical halyard hardware includes: (i) a cleat 105 for securing and retaining the end of the halyard used by a person to raise and lower the flag; (ii) a truck assembly 95 typically including a pulley located near the final through which the halyard passes; a weight 110 or ballast coupled to the other end of the halyard located below the attachment location of the flag; and a retaining ring 115 coupled to the halyard and weight and secured to the pole to permit free upwardly and downwardly movement there along. Hardware may also be provided on the halyard for coupling to the grommets of the flag such as metal rings and clamps to secure the rings to the halyard. In yet other variations, a simple loop or knot in the halyard at the appropriate location can be provided to receive a zip tie or other connector to attach the flag illumination assembly to thereto.

The halyard and halyard hardware illustrated in FIG. 5 is merely exemplary and is not intended to be limiting. Rather, embodiments of the flag illumination assembly can be used with most vertical flag poles and their halyard assemblies including those having substantially internal halyards. Generally, because the angle 15 of the flag illumination assembly is attached to a halyard or other flag pole hardware, such as that described above concerning an outrigger pole, by way of two or more attachment holes 25, which are similarly positioned relative to grommets on a vertical mounting edge of a typical flag, the illumination assembly can be used with most any type of flag pole and flag pole hardware with little or modifications necessary thereto.

Of note concerning the assembly 15 shown in FIG. 5, the cord 60 and associated power supply 30 are not illustrated; however, it is to be understood that in an actual installation of the flag illumination assembly a cord and a power supply would be present.

A Method of Using a Flag Illumination Assembly According to Embodiments

Most existing flag poles can accept an embodiment of a flag illumination assembly without modification. The illumination assembly is secured between a flag and the flag hanging hardware of the particular flag pole whether the flag pole is of the vertical or outrigger variety. The installation holes 25 provided on the elongated angle 15 are positioned substantially in the same position as the grommets of a flag the assembly is designed to work in conjunction with. Accordingly, the illumination assembly attaches to the flag hanging hardware in substantially the same manner as the flag would be attached to the hardware if the illumination assembly were not present.

The flag is attached to the illumination assembly rather than the flag hanging hardware of the flag pole through the same attachment holes in the elongated angle. As illustrated, the flag is attached to the illumination assembly using zip ties. It is appreciated that any other types of connectors can be used in place of zip ties as would be obvious to one of ordinary skill in the art to which the invention pertains.

The means and method of attaching the flag illumination assembly to the flag pole's associated hardware does not vary substantially whether the pole has fixed hardware or utilizes a halyard to permit the flag to be run up and down the pole. For those flag poles incorporating a halyard and associated hardware, the flag is deployed and retracted much in the same manner as without an illumination assembly except the flag is removed from the assembly instead of the flag hanging hardware of the halyard assembly.

Of additional consideration in the installation of embodiments of the flag illumination assembly is the electrical cord or conduit that is attached to the bottom end of the assembly and typically extends down or along the flag pole. For poles with fixed flag mounting positions, the cord can be run along the pole and secured thereto by any suitable means, such as with zip ties. In other variations, the cord may be allowed to freely hang. For poles with halyard assemblies that permit the flag to be raised or lowered, provisions must be made for the upwardly and downwardly movement of the cord as the flag is raised and lowered. Most simply, the cord can be allowed to hang parallel to the pole such that it with gather on the ground when the flag is lowered and easily extend when the flag is raised. In a slightly more complex variation, looped chains can be secured to the cord that wrap around the pole and slide upwardly and downwardly along the pole when the flag is raised or lowered. In yet another variation, a cord retractor can be provided either at the base of the flag pole or the base of the illumination assembly itself to dole out or retract excess cord as the flag is raised or lowered.

Once the flag illumination assembly has been installed and the electrical cord has been properly routed, the assembly need only be attached to a power source to be functional. In its simplest form, the cord terminates in a standard plug (a power supply is typically located in line along the cord) which when plugged in causes power to flow to the lights. In more complex variations, a user may need to set a timer to indicated when the power supply is to provide power to the lights. In yet other variations, power will flow to the lights only a night or dusk when a daylight sensor switches the power on. As described herein, the power source may also include a pack of batteries that are coupled to a photovoltaic panel in place of using standard household AC current.

A Method of Making a Flag Illumination Assembly According to Embodiments

To make embodiments of the flag illumination assembly, an elongated bar/rod of a specified length is required. The bar must include the aforementioned channel with reflective sides formed therein or the channel can be formed therein as a separate fabrication activity. For instance, wherein the bar comprises aluminum angle, lengths of the extruded the aluminum angle need only be cut to the proper length for a particular illumination assembly. In contrast, a plastic rod bar could be formed from a sheet of plastic or injection molded to make the bar with its associated channel. In yet another variation, a solid elongated bar of proper length can be machined to form the necessary channel therein. If the surfaces of the channel are not sufficiently reflective the channel surfaces can be coated or plated to provide the reflectivity. Finally, to prepare the elongated bar/rod for use the desired attachment holes are drilled or otherwise formed in the bar. Of note, in some variations, such as an injection molded plastic bar, the attachment holes can be molded in place during formation.

Next, an illumination device is provided or acquired. In the illustrated embodiment the illumination device comprises an off the shelf LED rope light of the desired length. Other types of lights can be provided as discussed above. As necessary, the rope light assembly can operatively wired to a suitable length of electrical cord/conduit which may or may not include an integral power supply and/or AC plug. As can be appreciated, certain variations can include specialized power supplies, such as those including timer circuits and daylight sensors and these will typically be provided separating and wired to the electrical cord as appropriate.

The illumination device is then secured within the channel of the bar/rod. In the illustrated embodiment, the LED rope light is adhesively secured in place at the bottom of the channel. In variations, the rope light can be secured in place mechanically such as with zip ties passing around the rope and through additional holes formed through the angle along its length. As can be appreciate the means of attaching the illumination device can vary depending on the type of device used.

As necessary and applicable, battery packs and photovoltaic panels are provided and configured as necessary for operative coupling with the remainder of the illumination assembly. In some variations, the panel and battery pack are configured to plug in or connect to the electrical cord and/or power supply during setup while in other variations the panel and battery pack can be hard wired to the assembly.

As a final operation, the entire assembly can optionally be packaged for shipment and sale in one or more boxes or other suitable containers. Instructions can be printed and may be included in the packaging or information provided necessary to access the instructions, such as on the internet.

Other Embodiments and Variations

The various preferred embodiments and variations thereof illustrated in the accompanying figures and/or described above are merely exemplary and are not meant to limit the scope of the invention. It is to be appreciated that numerous variations to the invention have been contemplated as would be obvious to one of ordinary skill in the art with the benefit of this disclosure.

We claim:

1. A flag illumination assembly comprising:

an elongated rod or bar including a channel extending substantially an entire length thereof, at least one surface of the channel being reflective, and the rod including at least a first bore proximate a top end and a second bore proximate a bottom end, wherein the rod is detachably coupled to a flag and a flag pole by fasteners extending through the first bore and the second bore; and a plurality of lights distributed along and secured to a substantial portion of a length of the channel.

2. The assembly of claim 1, wherein the elongated bar is comprised of aluminum.

3. The assembly of claim 1, wherein the plurality of lights comprise a plurality of light emitting diodes (LEDs).

4. The assembly of claim 3, wherein the plurality of LEDs comprise a rope light.

5. The assembly of claim 4, wherein the rope light is adhesively secured to the elongated bar within the channel.

6. The assembly of claim 1 further comprising a power supply adapted to provide electricity to the plurality of lights.

7. The assembly of claim 1, including one or more photovoltaic cells and one or more rechargeable batteries operatively coupled with the plurality of lights.

8. The assembly of claim 6, further including an AC plug coupled with the power supply for connecting to an AC power source.

9. The assembly of claim 6, wherein the power supply further includes a daylight sensor and associated switch adapted to regulate the flow of electricity to the plurality of lights depending on a level of ambient light.

10. The assembly of claim 6, wherein the power supply further includes a timer circuit and associated switch adapted to regulate the flow of electricity to the plurality of lights for a given period of time.

11. A combination comprising:
- an elongated bar including a channel extending substantially an entire length thereof, at least one surface of the channel being reflective, and the bar including at least a first bore proximate a top end and a second bore proximate a bottom end;
- a plurality of lights distributed along and secured to a substantial portion of a length of the channel;
- a flag, wherein the elongated bar is detachably attached proximate a vertical side of the flag by (i) a first fastener that extends through an upper grommet on the flag and the first bore, and (ii) a second fastener that extends through a lower grommet on the flag and the second bore; and
- a flag pole a flag pole detachably coupled to the elongated bar.

12. The combination of claim 11 further including a halyard, the flag and the elongated bar being coupled to the halyard by at least a third fastener, and the halyard being operatively coupled to the flag pole.

13. The combination of claim 11, wherein the flag and the elongated bar are coupled to the flag pole by way of at least a third fastener.

14. The combination of claim 13, further comprising a power supply operatively coupled to the plurality of lights, the power supply including a light sensor and switch adapted to turn the power supply on when ambient light falls below a certain predetermined level.

15. The combination of claim 14, further comprising a battery pack and a photovoltaic panel in operative coupling with the power supply.

16. The combination of claim 12 wherein the plurality of lights comprise LEDs and the LEDs comprise a light rope and the light rope is adhesively secured to the elongated bar within the channel.

17. A method of flag illumination, the method comprising:
- providing an elongated bar including a channel extending substantially an entire length thereof, at least one surface of the channel being reflective, and the bar including at least a first bore proximate a top end and a second bore proximate a bottom end;
- distributing a plurality of lights along a substantial portion of a length of the channel;
- securing the plurality of lights in the channel; and
- detachably coupling the elongated bar to a flag and a flag pole using fasteners extending through the first bore and the second bore.

18. The method of claim 17 wherein the plurality of lights comprise an LED light rope and said securing comprises adhesively attaching the light rope in the channel.

19. The method of claim 17, further comprising:
- connecting an electrical power cord that is coupled to the plurality of lights to a power source.

20. The method of claim 19, further comprising raising the flag on the flag pole, wherein the elongated bar is detachably coupled to the flag pole via a halyard and associated hardware.

* * * * *